(12) United States Patent
Lee et al.

(10) Patent No.: US 11,764,145 B2
(45) Date of Patent: Sep. 19, 2023

(54) WIRING STRUCTURE HAVING DOUBLE CAPPING STRUCTURE, MANUFACTURING METHOD THEREOF, AND INTEGRATED CIRCUIT CHIP HAVING THE SAME

(71) Applicant: SAMSUNG ELECTRONICS CO., LTD., Suwon-si (KR)

(72) Inventors: Jaejin Lee, Goyang-si (KR); Hana Kim, Hwaseong-si (KR); Jaewha Park, Yongin-si (KR); Dongchan Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 17/223,144

(22) Filed: Apr. 6, 2021

(65) Prior Publication Data
US 2022/0084939 A1 Mar. 17, 2022

(30) Foreign Application Priority Data
Sep. 17, 2020 (KR) .................. 10-2020-0119655

(51) Int. Cl.
*H01L 23/522* (2006.01)
*H01L 23/528* (2006.01)
*H01L 21/768* (2006.01)
*H01L 23/532* (2006.01)

(52) U.S. Cl.
CPC .... *H01L 23/5226* (2013.01); *H01L 21/76841* (2013.01); *H01L 21/76877* (2013.01); *H01L 23/528* (2013.01); *H01L 23/53238* (2013.01)

(58) Field of Classification Search
CPC ..... H01L 23/50; H01L 23/522; H01L 23/528; H01L 23/532; H01L 23/485; H01L 23/498; H01L 23/525; H01L 23/5226; H01L 23/53238; H01L 23/5283; H01L 23/53209; H01L 23/49827; H01L 23/49838; H01L 23/49866; H01L 21/768; H01L 21/76841; H01L 21/76843; H01L 21/76877; H01L 21/76849; H01L 21/76816; H01L 21/76831; H01L 21/76832; H01L 21/76879
USPC ........................................ 257/751
See application file for complete search history.

(56) References Cited

U.S. PATENT DOCUMENTS

| | | |
|---|---|---|
| 8,361,237 B2 | 1/2013 | Wu et al. |
| 9,455,182 B2 | 9/2016 | Edelstein et al. |
| 9,659,869 B2 | 5/2017 | Jezewski et al. |
| 9,711,452 B2 | 7/2017 | Clevenger et al. |
| 9,837,356 B1 | 12/2017 | Yang |
| 9,911,698 B1 | 3/2018 | Yang |
| 9,947,581 B2 | 4/2018 | Edelstein et al. |
| 10,170,425 B2 | 1/2019 | He et al. |
| 10,529,663 B1 | 1/2020 | Nogami et al. |

(Continued)

*Primary Examiner* — Chuong A Luu
(74) *Attorney, Agent, or Firm* — Lee IP Law, P.C.

(57) ABSTRACT

A wiring structure includes a filling metal, a cover metal including cobalt (Co) on the filling metal, the cover metal having a first portion along a side surface and along a lower surface of the filling metal, and a second portion along an upper surface of the filling metal, a barrier metal on an outer surface of the first portion of the cover metal, and a capping metal on an outer surface of the second portion of the cover metal, the capping metal including a cobalt (Co) alloy, wherein the filling metal has higher conductivity than the cover metal and the barrier metal.

14 Claims, 10 Drawing Sheets

(56) References Cited

U.S. PATENT DOCUMENTS

2013/0277842 A1* 10/2013 Baumann .......... H01L 23/53238
  257/E23.161
2014/0097538 A1 4/2014 Zhao et al.
2016/0056112 A1* 2/2016 Edelstein ............ H01L 21/7685
  257/751
2022/0367663 A1* 11/2022 Chiu ............... H01L 21/823437

* cited by examiner

WIRING STRUCTURE HAVING DOUBLE CAPPING STRUCTURE, MANUFACTURING METHOD THEREOF, AND INTEGRATED CIRCUIT CHIP HAVING THE SAME

CROSS-REFERENCE TO THE RELATED APPLICATION

Korean Patent Application No. 10-2020-0119655, filed on Sep. 17, 2020, in the Korean Intellectual Property Office, and entitled: "Wiring Structure Having Double Capping Structure, Manufacturing Method Thereof, and Integrated Circuit Chip Having the Same," is incorporated by reference herein in its entirety.

BACKGROUND

1. Field

The exemplary embodiments of the disclosure relate to a wiring structure, a manufacturing method thereof, and an integrated circuit chip having the same.

2. Description of the Related Art

In accordance with the advance of electronic technologies, in recent years, down-scaling of semiconductor devices has rapidly progressed. To this end, high integration and low power of semiconductor chips are required. In order to cope with the requirement of high integration and low power of the semiconductor chips, a feature size of the semiconductor devices is being steadily reduced.

SUMMARY

According to an aspect of the present disclosure, there is provided a wiring structure. The wiring structure includes a filling metal, a cover metal including a first portion disposed along a side surface and a lower surface of the filling metal, and a second portion disposed along an upper surface of the filling metal, the cover metal including cobalt (Co), a barrier metal disposed outside the first portion, and a capping metal disposed outside the second portion, the capping metal including a cobalt (Co) alloy, wherein the filling metal has higher conductivity than the cover metal and the barrier metal.

According to an aspect of the present disclosure, there is provided an integrated circuit chip. The integrated circuit chip includes a substrate, a front-end-of-line (FEOL) structure formed on one surface of the substrate, the FEOL structure including a plurality of transistors, and a back-end-of-line (BEOL) structure formed on the FEOL structure, the BEOL structure including a multilayer wiring structure, and an interlayer insulating film constituted by a plurality of sub-insulating films for mutually insulating a part of the multilayer wiring structure, wherein one wiring structure of the multilayer wiring structure is disposed in a trench formed at one sub-insulating film of the interlayer insulating film, wherein the one wiring structure includes a filling metal formed in the trench, the filling metal including copper (Cu), a cover metal including a first portion disposed along a side surface and a lower surface of the fill metal, and a second portion disposed along an upper surface of the filling metal, the cover metal including cobalt (Co), a barrier metal disposed outside the first portion while being directly disposed on the trench, a capping metal disposed outside the second portion, the capping metal including a cobalt (Co) alloy, and a top metal disposed outside the capping metal, the top metal including manganese (Mn).

According to an aspect of the present disclosure, there is provided a method for manufacturing a wiring structure. The method includes depositing a barrier metal material on one surface of an insulating film including a trench at the one surface thereof, depositing a copper-manganese (CuMn) alloy on the barrier metal material, plating a filling metal material including copper (Cu) on the copper-manganese (CuMn) alloy, removing portions of the barrier metal material, the copper-manganese (CuMn) alloy and the copper (Cu) disposed outside the trench, selectively depositing a cover metal material including pure cobalt (Co) on an upper surface of the copper (Cu), selectively depositing a capping metal material including a cobalt (Co) alloy on an upper surface of the cobalt (Co), and annealing the resultant structure at a temperature of 300 to 600° C.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
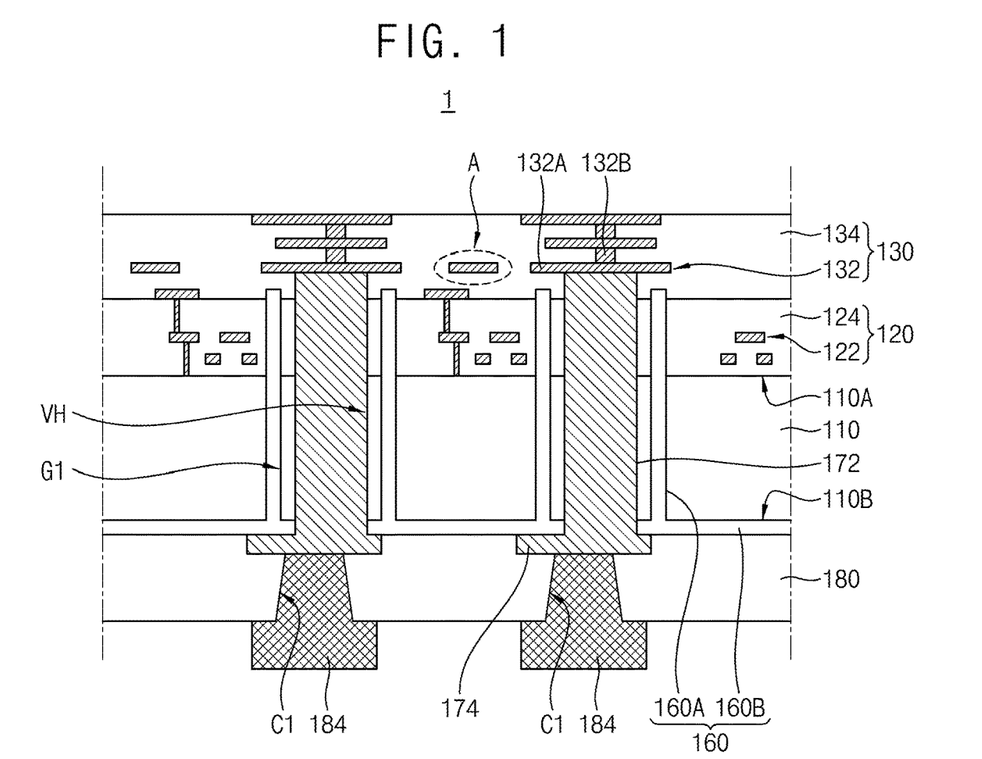
FIG. 1 is a sectional view of a portion of an integrated circuit chip according to an exemplary embodiment of the disclosure.

FIG. 1 is a sectional view of a portion of an integrated circuit chip according to an exemplary embodiment of the disclosure.

Referring to FIG. 1, an integrated circuit chip 1 may include a substrate 110 having opposite surfaces, i.e., an active surface 110A and a back surface 110B, a front-end-of-line (FEOL) structure 120 formed on the active surface 110A of the substrate 110, and a back-end-of-line (BEOL) structure 130 formed on the FEOL structure 120.

In an embodiment, the integrated circuit chip 1 may include an integrated circuit. For example, the integrated circuit may be applied to memory chips such as volatile memory, e.g., dynamic random-access memory (DRAM), non-volatile memory, e.g., read-only memory (ROM), flash memory, etc., application processor chips, e.g., a central processor unit (CPU), a graphics processor unit (GPU), a digital signal processor, a crypto-processor, a microprocessor, a microcontroller, etc., and logic chips, e.g., an analog-digital converter, an application-specific integrated circuit (ASIC), etc. The integrated circuit may also be applied to a power management chip, e.g., a power management integrated circuit (PMIC).

The substrate 110 may be made of a semiconductor material, e.g., silicon (Si). In an embodiment, the thickness of the substrate 110, e.g., along a vertical direction between the active surface 110A and the back surface 110B, may be about 5 µm to 10 µm.

The FEOL structure 120 may include an integrated circuit 122, and a first interlayer insulating film 124 for mutually insulating individual devices constituting the integrated circuit 122. The first interlayer insulating film 124 may be formed to cover the active surface 110A of the substrate 110.

The integrated circuit 122 may include various circuits and various wiring structures formed on the active surface 110A of the substrate 110. For example, the integrated circuit 122 may include various microelectronic devices, e.g., a metal-oxide-semiconductor field effect transistor (MOSFET), a system large scale integration (LSI), a microelectromechanical system (MEMS), an active device, or a passive device including a plurality of transistors.

A part of a plurality of individual devices constituting the integrated circuit 122 may be configured to be electrically connected to a well constituted by a conductive region, e.g., an ion implementation region. Neighboring ones of the plurality of individual devices may be electrically isolated from each other by the first interlayer insulating film 124.

The BEOL structure 130 may include a plurality of multilayer wiring structures 132 connected to the integrated circuit 122 of the FEOL structure 120, and a second interlayer insulating film 134 for mutually insulating a part of the plurality of multilayer wiring structures 132. The second interlayer insulating film 134 may be formed to cover the FEOL structure 120. For example, a passivation film may be further disposed on the BEOL structure 130.

The plurality of multilayer wiring structures 132 may include a plurality of wiring structures 132A and a plurality of contact plugs 132B. Each of the plurality of contact plugs 132B may be between adjacent ones of the plurality of wiring structures 132A to interconnect the adjacent ones of the plurality of wiring structures 132A. A detailed configuration of the wiring structures 132A will be described in more detail below with reference to FIGS. 2 and 3.

The integrated circuit chip 1 may further include a plurality of through electrodes 172. Each through electrode 172 may vertically extend in a through via hole VH extending through the substrate 110, the first interlayer insulating film 124 of the FEOL structure 120, and a portion of the second interlayer insulating film 134 of the BEOL structure 130. Each through electrode 172 may be connected to one multilayer wiring structure 132 of the multilayer wiring structures 132. Each of the plurality of through electrodes 172 may contact, at one end thereof, the wiring structure 132A disposed adjacent to the FEOL structure 120 from among the plurality of wiring structures 132A constituting the multilayer wiring structure 132, e.g., a first end of each through electrode 172 may extend into the second interlayer insulating film 134 of the BEOL structure 130 to directly contact a lowermost portion of a multilayer wiring structure 132 adjacent thereto. Each of the plurality of through electrodes 172 may contact one of a plurality of pads 174 at the other end thereof, e.g., a second end of each through electrode 172 may be opposite to the first end and directly contact a corresponding one of the plurality of pads 174 adjacent thereto.

The plurality of pads 174 may face the back surface 110B of the substrate 110 while extending in a horizontal direction. The plurality of through electrodes 172 and the plurality of pads 174 may be integrally connected one to one.

In an embodiment, each of the through electrodes 172 and the pads 174 may include a metal-containing conductive layer made of, e.g., metal, a conductive metal nitride, or a combination thereof. For example, each of the through electrodes 172 and the pads 174 may be made of tungsten (W), aluminum (Al), titanium (Ti), titanium nitride (TiN), or a combination thereof.

A groove G1 may be formed around each of the plurality of through electrodes 172, e.g., the groove G1 may surround an entire perimeter of each of the plurality of through electrodes 172. The groove G1 may be constituted by a ring-shaped space extending vertically through the substrate 110 and the first interlayer insulating film 124 of the FEOL structure 120.

The integrated circuit chip 1 may further include an insulating film 160. The insulating film 160 may include a plurality of through insulators 160A filling respective grooves G1, and an insulating liner 160B integrally connected to the plurality of through insulators 160A while covering the back surface 110B of the substrate 110. Each of the plurality of through insulators 160A may surround at least a portion of a corresponding one of the through electrodes 172 at a position horizontally spaced apart from the corresponding through electrode 172. The plurality of pads 174 may be spaced apart from the substrate 110 such that the insulating liner 160B is disposed between the plurality of pads 174 and the substrate 110. For example, as illustrated in FIG. 1, each one of the through electrodes 172 may, e.g., continuously, extend through a portion of the second interlayer insulating film 134 of the BEOL structure 130, through the entire thickness of the first interlayer insulating film 124 of the FEOL structure 120, through the entire thickness of the substrate 110, and through the insulating liner 160B to contact a corresponding pad 174.

In an embodiment, the insulating film 160 may include, e.g., an aluminum oxide film or a hafnium oxide film. In some embodiments, at least a part of the plurality of through insulators 160A may include an air gap. In the disclosure, the term "air" may mean the atmosphere or other gases present during a manufacturing process. The plurality of through insulators 160A may have a ring-shaped planar structure, e.g., may have a ring shape surrounding the corresponding through electrode 172 in a plan view.

The integrated circuit chip 1 may further include a passivation film 180. The insulating film 160 and the plurality of pads 174 may be covered by the passivation film 180. In an embodiment, the passivation film 180 may include, e.g., an oxide film, a nitride film, or a combination thereof.

The integrated circuit chip 1 may include a plurality of connecting terminals 184 formed on the passivation film 180. The plurality of connecting terminals 184 may be connected to the pads 174 via contact holes C1 formed in the passivation film 180, respectively. In some embodiments, the plurality of connecting terminals 184 may include, e.g., gold (Au) bumps, respectively.

Figure 2:
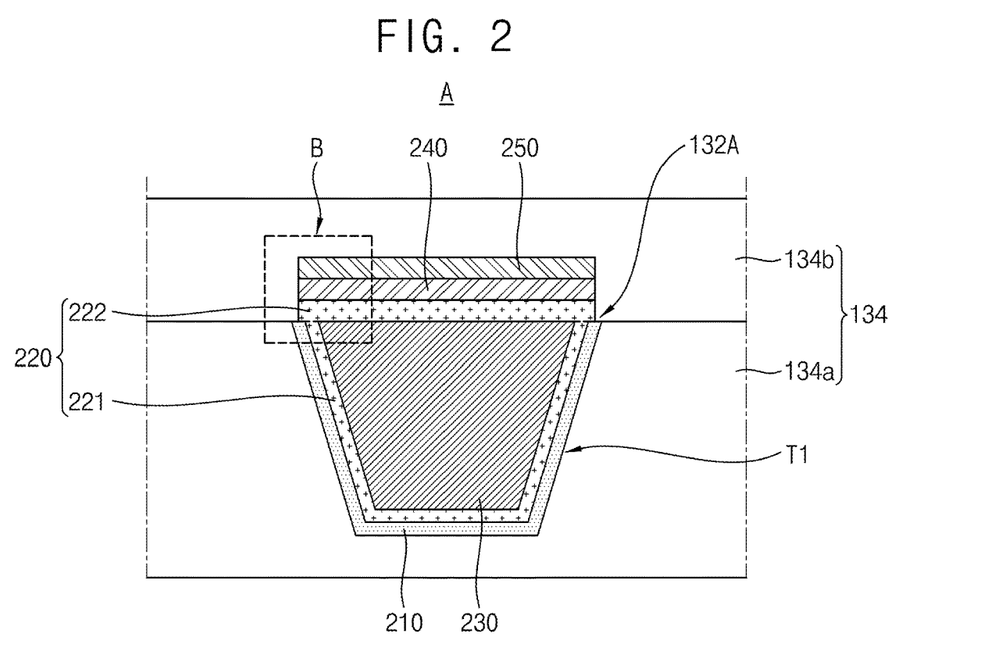
FIG. 2 is a sectional view of a wiring structure according to an exemplary embodiment of the disclosure.
Figure 3:
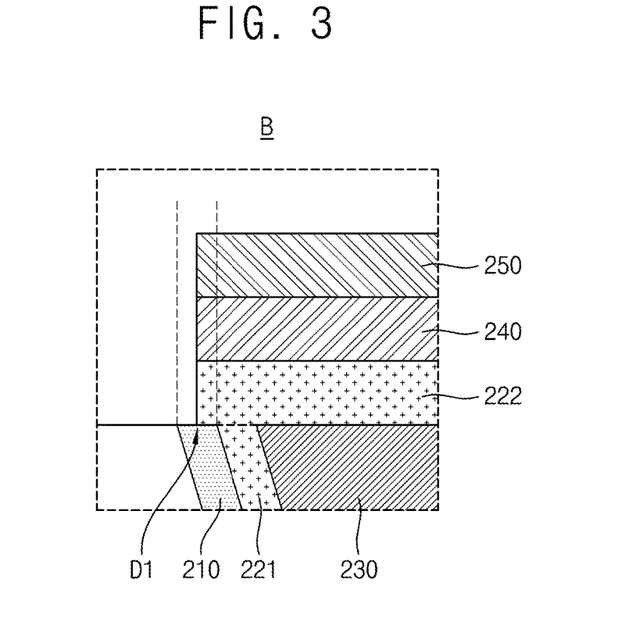
FIG. 3 is an enlarged sectional view of a region B in FIG. 2.

FIG. 2 is an enlarged and detailed cross-sectional view of section A in FIG., illustrating a portion of the wiring structure 132. FIG. 3 is an enlarged sectional view of region B in FIG. 2. For convenience of description, the second interlayer insulating film 134 is also shown in FIG. 2.

Referring to FIGS. 2 and 3, in an embodiment, the second interlayer insulating film 134 may include a stacked structure of a plurality of sub-insulating films. For example, the second interlayer insulating film 134 may include a first sub-insulating film 134a and a second sub-insulating film 134b disposed on the first sub-insulating film 134a.

A trench T1 may be formed at one surface of the first sub-insulating film 134a in order to dispose the wiring structure 132A. The one surface of the first sub-insulating film 134a corresponds to a surface of the first sub-insulating film 134a contacting the second sub-insulating film 134b.

In an embodiment, the trench T1 formed at the one surface of the first sub-insulating film 134a may be formed such that a width at an upper portion thereof is greater than a width at a lower portion thereof. For example, the trench T1 may have a trapezoidal shape having a greater width at an upper portion thereof when viewed in cross-section. For example, a bottom surface of the trench T1 may be parallel to the one surface of the first sub-insulating film 134a, and opposite side walls of the trench T1 may be inclined surfaces.

For example, the first and second sub-insulating films 134a and second sub-insulating film 134b of the second interlayer insulating film 134 may include a same material or different materials. For example, the first and second sub-insulating films 134a and second sub-insulating film 134b of the second interlayer insulating film 134 may include at least one of silicon oxide, silicon nitride, silicon oxynitride, and low-k dielectrics. In an embodiment, the second interlayer insulating film 134 may include low-k dielectrics in order to alleviate a coupling phenomenon occurring between wiring structures 132A. For example, the low-k dielectrics may be a silicon oxide having appropriately high carbon and hydrogen contents, e.g., SiCOH. Meanwhile, as carbon is contained in the insulating material, the dielectric constant of the insulating material may be lowered. In order to further reduce the dielectric constant of the insulating material, the insulating material may be filled with gas therein or may include a pore, e.g., a cavity, filled with air. For example, the low-k dielectrics may include fluorinated tetraethylorthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDS), trimethylsilyl borate (TMSB), diacetoxyditertiarybutoxysilane (DADBS), trimethylsilyl phosphate (TMSP), polytetrafluoroethylene (PTFE), Tonen Silazene (TOSZ), fluoride silicate glass (FSG), polyimide nanofoams, e.g., polypropylene oxide, carbon doped silicon oxide (CDO), organosilicate glass (OSG), SiLK, amorphous fluorinated carbon, silica aerogels, silica xerogels, mesoporous silica, or a combination thereof, without being limited thereto.

The wiring structure 132A may be filled in the trench T1 of the first sub-insulating film 134a, and the second sub-insulating film 134b may cover the wiring structure 132A. In an embodiment, the wiring structure 132A may include a barrier metal 210, a filling metal 230, a cover metal 220, a capping metal 240, and a top metal 250.

The barrier metal 210 may be directly disposed on the trench T1 of the first sub-insulating film 134a. The barrier metal 210 may extend, e.g., conformally, along the side walls and bottom surface of the trench T1.

The barrier metal 210 may include a function of reducing a movement phenomenon of metal ions of the filling metal 230, i.e., reduce electromigration (EM) and diffusion of metal ions from the filling metal 230 into the first sub-insulating film 134a. For example, the barrier metal 210 may include tantalum (Ta) or tantalum nitride (TaN). In another example, the barrier metal 210 may include at least one of titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh).

The filling metal 230 may fill the trench T1 of the first sub-insulating film 134a, e.g., upper surface of the filling metal 230 and the first sub-insulating film 134a may be coplanar. The shape of the filling metal 230 may correspond to the shape of the trench T1 when viewed in cross-section. The filling metal 230 may be disposed on the barrier metal 210. In an embodiment, the filling metal 230 may have a shape corresponding to the shape of the trench T1 such that the filling metal 230 may have a trapezoidal shape having a greater width at an upper portion thereof when viewed in cross-section. For example, the filling metal 230 may include upper and lower surfaces parallel to each other, and opposite side surfaces which are inclined surfaces, e.g., at oblique angles.

The filling metal 230 may include a material having relatively low resistance and high, e.g., electrical, conductivity. In accordance with embodiments, the filling metal 230 may be a material having low resistance and high conductivity, as compared to other constituent elements in the wiring structure 132A. In an embodiment, the filling metal 230 may include copper (Cu). In accordance with embodiments, when the filling metal 230 includes copper, copper included in the filling metal 230 may include, e.g., at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), or zirconium (Zr). In another embodiment, the filling metal 230 may include, e.g., aluminum (Al), tungsten (W), and/or cobalt (Co). For example, the filling metal 230 may include copper and may further include one of the enumerated elements, e.g., an alloy of copper and at least one of the enumerated elements.

The cover metal 220 may be formed along an edge of the filling metal 230. The cover metal 220 may include a first portion 221 formed, e.g., disposed, along the side surfaces and lower surface of the filling metal 230, and a second portion 222 formed, e.g., disposed, along the upper surface of the filling metal 230. The first portion 221 and the second portion 222 may be, e.g., directly, connected to each other.

For example, the first portion 221 of the cover metal 220 may extend directly and conformally on the barrier metal 210, and may be disposed between the barrier metal 210 and the filling metal 230, e.g., the first portion 221 of the cover metal 220 may completely separate between the barrier metal 210 and the filling metal 230. For example, the first portion 221 of the cover metal 220 may contact the barrier metal 210 at an outer surface thereof while contacting the filling metal 230 at an inner surface thereof. That is, the barrier metal 210 may be disposed outside the second portion 222 of the cover metal 220, and the filling metal 230 may be disposed inside the cover metal 220. For example, the continuous extension of the first portion 221 along the sidewalls and bottom of the barrier metal 210 may improve, e.g., restore, a variation in characteristics of the barrier metal 210 caused by physical vapor deposition (PVD) used in some semiconductor device, e.g., DRAM, processes, e.g., (e.g., due to the tantalum (Ta) or tantalum nitride (TaN) included in the barrier metal 210). As such, the first portion 221 may prevent or help minimize reduction of EM life.

The second portion 222 of the cover metal 220 may be disposed over the filling metal 230. In an embodiment, an upper surface of the second portion 222 of the cover metal 220 may be formed at a higher position than the one surface (upper surface) of the first sub-insulating film 134a. The second portion 222 of the cover metal 220 may completely cover the upper surface of the filling metal 230 such that the upper surface of the filling metal 230 is not exposed. In an embodiment, the first portion 221 of the cover metal 220 may have a quadrangular shape when viewed in cross-section. An upper surface of the first portion 221 of the cover metal 220 may be substantially flat.

As illustrated in FIG. 3, an outer edge D1 of the second portion 222 of the cover metal 220 may overlap with an uppermost surface of the barrier metal 210. The outer edge D1 of the second portion 222 of the cover metal 220 may be formed at the inside or outside of the uppermost surface of the barrier metal 210.

In an embodiment, the thickness of the first portion 221 may be about 5 nm or less. In accordance with embodiments, the first and second portions 221 and 222 of the cover metal 220 may have different thicknesses, respectively. For example, the thickness of the first portion 221 of the cover metal 220 may be smaller than the thickness of the second portion 222. In an embodiment, an oxygen content (%) of the first and second portions 221 and 222 of the cover metal 220 may be equal.

The cover metal 220 may include a function of reducing EM and diffusion of the filling metal 230. In an embodiment, the cover metal 220 may include cobalt (Co). For example, the cover metal 220 may include pure cobalt (Co), e.g., the cover metal 220 may consist of cobalt (Co) (without other elements), i.e., the cover metal 220 may be a non-compounded cobalt and/or non-alloyed cobalt.

The capping metal 240 may be directly disposed on the second portion 222 of the cover metal 220, i.e., at the outside of second portion 222. In an embodiment, the capping metal 240 may be formed at a higher position than the upper surface of the first sub-insulating film 134a.

The capping metal 240 may achieve double capping of an upper portion of the filling metal 230, together with the second portion 222 of the cover metal 220. That is, the capping metal 240 may more effectively reduce EM and diffusion of the filling metal 230, together with the second portion 222.

In an embodiment, the capping metal 240 may include a cobalt (Co) alloy. For example, the cobalt (Co) alloy may be an alloy including cobalt (Co) and at least one of gold (Au), silver (Ag), tungsten (W), lead (Pb), and phosphorous (P). For example, the capping metal 240 may be a cobalt-tungsten-phosphorous (CoWP) alloy. In an embodiment, the capping metal 240 may not include manganese (Mn), and the cover metal 220 may not include manganese (Mn).

In an embodiment, the capping metal 240 may have a quadrangular shape when viewed in cross-section. An upper surface of the capping metal may be substantially flat.

The top metal 250 may be formed on the capping metal 240, e.g., the capping metal 240 may be between the top metal 250 and the second portion 222 of the cover metal 220. The top metal 250 may be directly on the capping metal 240, e.g., on an outer surface of the capping metal 240 that faces away from the second portion 222 of the cover metal 220. In an embodiment, the top metal 250 may include manganese (Mn). In an embodiment, the top metal 250 may not contact the cover metal 220, e.g., the capping metal 240 may completely separate between the top metal 250 and the second portion 222 of the cover metal 220.

Figure 4:
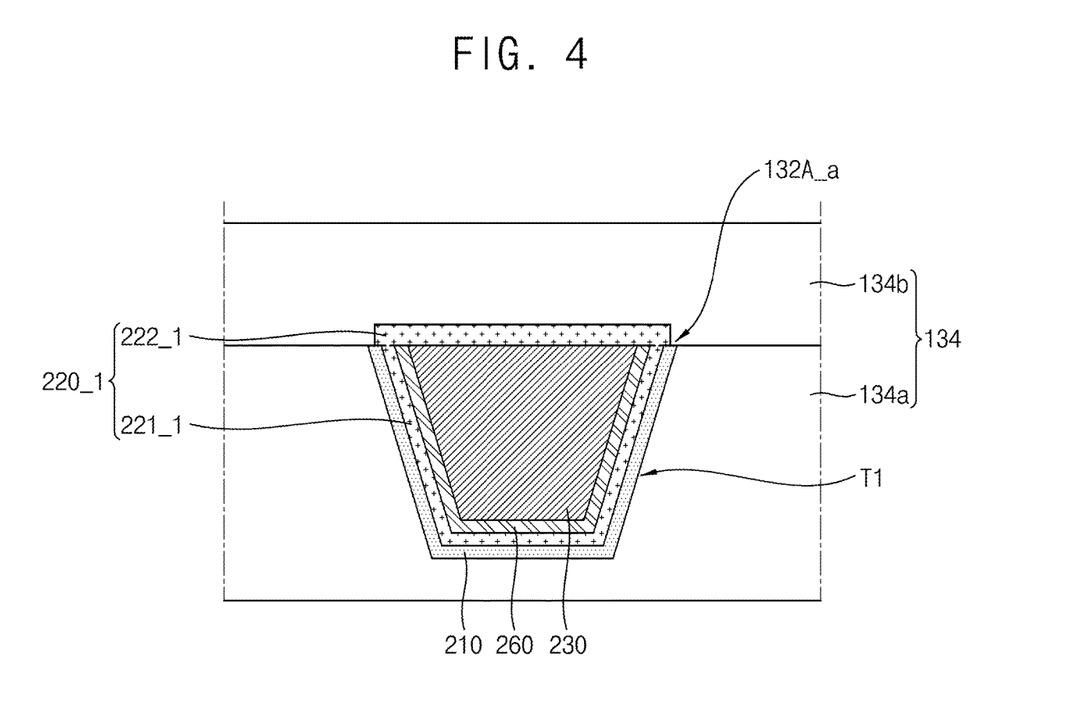
FIGS. 4 to 6 are sectional views of wiring structures according to comparative examples of the disclosure, respectively.
Figure 5:
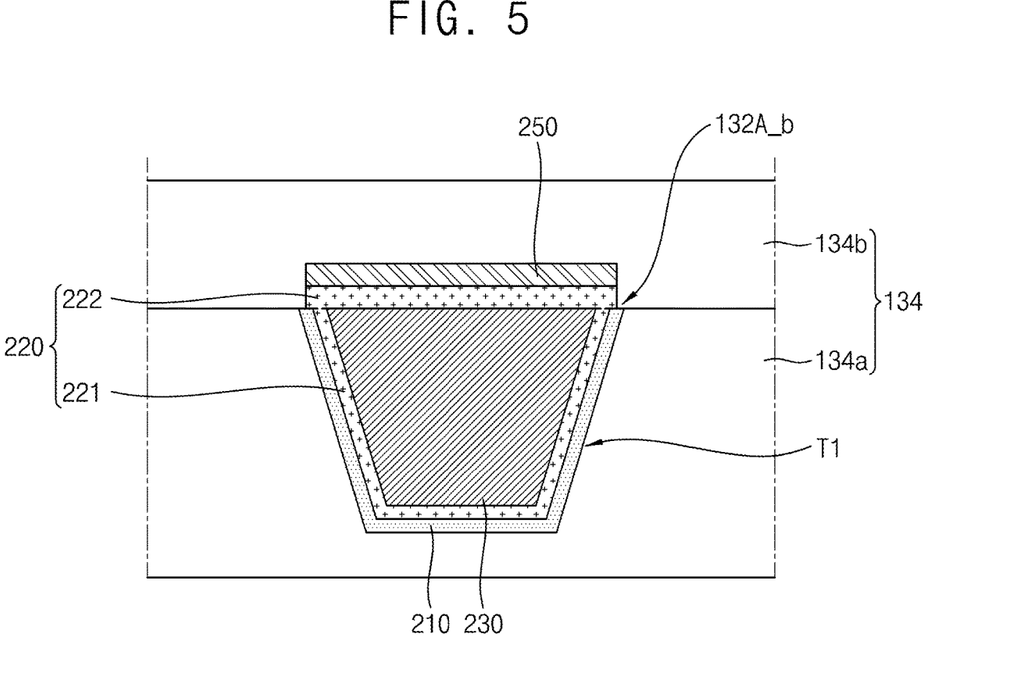
Figure 6:
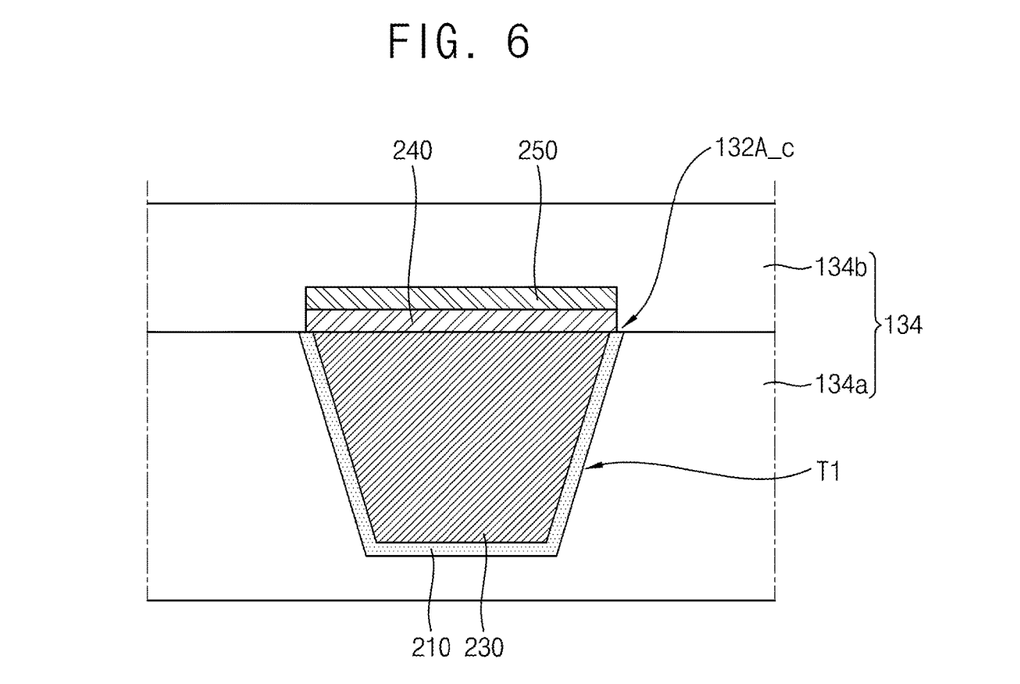
Figure 7:
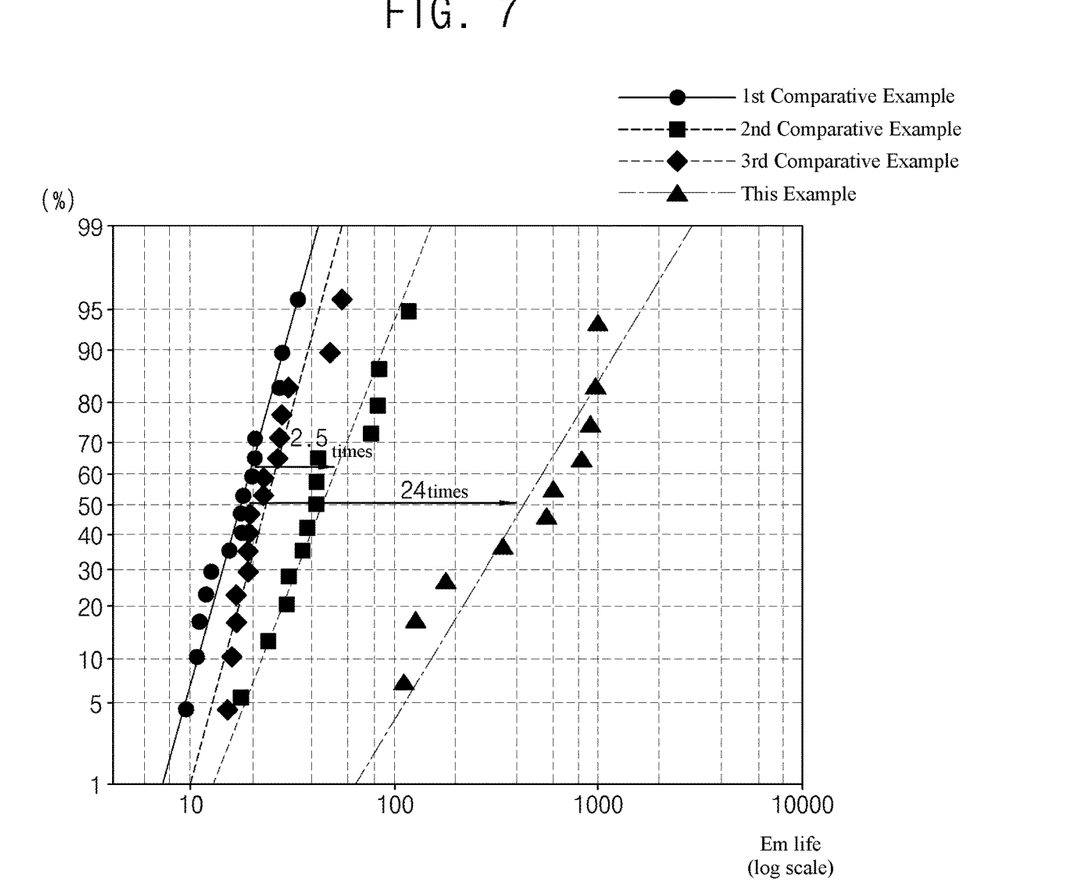
FIG. 7 is a graph depicting EM life of an example and comparative examples of the disclosure.

FIGS. 4 to 6 are sectional views of wiring structures according to comparative examples. FIG. 7 is a graph depicting EM life of an example and comparative examples of the disclosure.

The following comparative examples are described relative to the example embodiment of FIGS. 2-3, in order to explain distinguishable points of the example embodiments. In the comparative examples, identical or similar reference numerals are used for constituent elements corresponding to those of the example of the disclosure.

Referring to FIGS. 2 and 4, a wiring structure 132A_a according to a first comparative example differs from the wiring structure 132A according to the example of the disclosure in that the capping metal 240 and the top metal 250 are omitted, and a second cover metal 260 is further included between the filling metal 230 and a first portion 221_1 of a cover metal 220_1 (in this comparative example, referred to as a "first cover metal 220_1").

The second cover metal 260 in the wiring structure 132A_a according to the first comparative example may be the same material as the top metal 250 in the example of the disclosure. For example, the second cover metal 260 may include manganese (Mn). Meanwhile, the oxygen content (%) of the first portion 221_1 of the first cover metal 220_1 may differ from that of a second portion 222_1 of the first cover metal 220_1. For example, the oxygen content (%) of the first portion 221_1 may be higher than that of the second portion 222_1. Accordingly, the second cover metal 260 including manganese (Mn) may be formed adjacent to the first portion 221_1 of the first cover metal 220_1 having a high oxygen content (%). The thickness of the first portion 221_1 of the first cover metal 220_1 in the wiring structure 132A_a according to the first comparative example may be 15 nm or more.

Referring to FIGS. 2 and 5, a wiring structure 132A_b according to a second comparative example differs from the wiring structure 132A according to the example of the disclosure in that the capping metal 240 is omitted. In addition, although not clearly shown, in some cases associated with the wiring structure 132A_b according to the second comparative example, the second portion 222 of the cover metal 220 may incompletely cover the upper surface of the filling metal 230 and, as such, a portion of the upper surface of the filling metal 230 may be exposed.

Referring to FIGS. 2 and 6, a wiring structure 132A_c according to a third comparative example differs from the wiring structure 132A according to the example of the disclosure in that the cover metal 220 is omitted.

The graph of FIG. 7 depicts measured values obtained through accelerated experimentation. The x-axis of the graph represents a relative value of a time when a measurement for an EM life of each wiring structure is completed, and the y-axis of the graph represents a rate (%) of a filling metal material (e.g., copper (Cu)) in a specific part at the outside of each wiring structure.

Referring to FIG. 7, the wiring structure 132A according to the example of the disclosure (i.e., the curve illustrated by triangles in FIG. 7) may have increased EM life, as compared to the wiring structure 132A_c according to the third comparative example. The wiring structure 132A_c according to the third comparative example may have increased EM life, as compared to the wiring structure 132A_b according to the second comparative example. The wiring structure 132A_b according to the second comparative example may have increased EM life, as compared to the wiring structure 132A_a according to the first comparative example. Here, "EM life" refers to a period in which the filling metal 230 in the wiring structure 132A maintains conductivity equal to or higher than a predetermined reference value or a period in which the filling metal 230 in the wiring structure 132A is diffused to the outside of the wiring structure 132A due to EM thereof.

As shown, when each measured value is normalized, the EM life of the wiring structure 132A according to the example of the disclosure is substantially larger, as compared to the first, second and third comparative examples. That is, while the wiring structure 132A_c according to the third comparative example (having a larger EM life as compared to other example embodiments) may exhibit an increase of EM life by about 2.5 times, as compared to that of the wiring structure 132A_a according to the first comparative example, the EM life of the wiring structure 132A according to the example of the disclosure may exhibit an increase of EM life by about 24 times, as compared to the wiring structure 132A_a according to the first comparative example.

FIGS. 8 to 13 are sectional views of stages in a manufacturing method of the wiring structure 132A according to an exemplary embodiment of the disclosure. The cross-section of FIGS. 8-13 correspond to the cross-section of FIG. 2.

Figure 8:
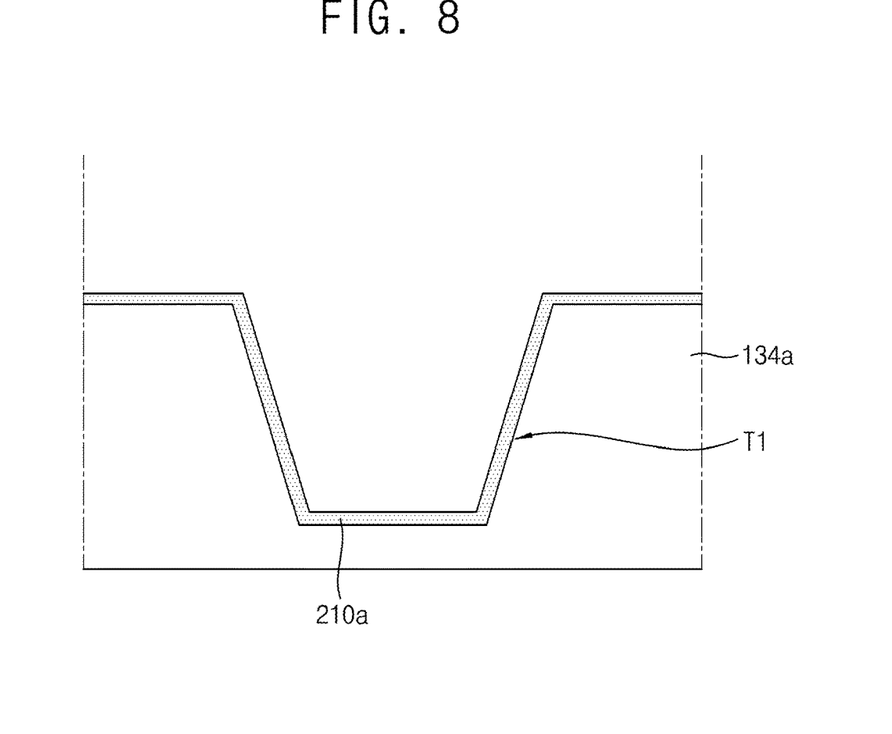
FIGS. 8 to 13 are sectional views of stages in a manufacturing method of a wiring structure according to an exemplary embodiment of the disclosure.

Referring to FIG. 8, a barrier metal material 210a may be formed over the entire surface of the first sub-insulating film 134a formed with the trench T1. Here, the barrier metal material 210a may include the same material as the above-described barrier metal 210. In an embodiment, the barrier metal material 210a may be formed on an upper surface of the first sub-insulating film 134a through a physical vapor deposition (PVD) process or a chemical vapor deposition (CVD) process.

Figure 9:
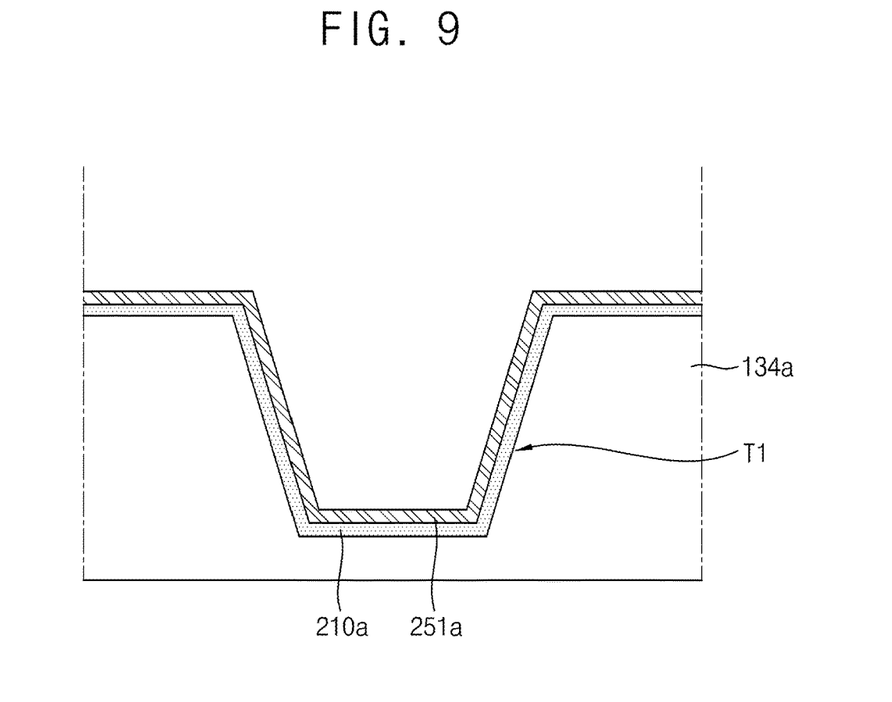

Referring to FIG. 9, a copper-manganese (CuMn) alloy 251a may be formed on the barrier metal material 210a. In an embodiment, the copper-manganese (CuMn) alloy 251a may be formed on an upper surface of the barrier metal material 210a through a physical vapor deposition (PVD) process or a chemical vapor deposition (CVD) process.

Figure 10:
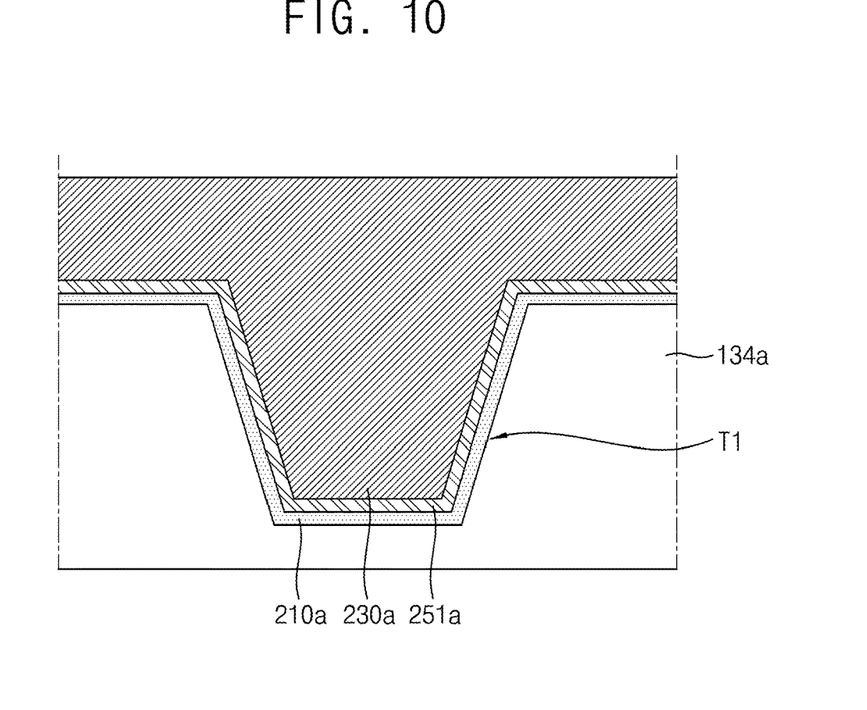

Referring to FIG. 10, a filling metal material 230a may be formed on the copper-manganese (CuMn) alloy 251a. Here, the filling metal material 230a may include the same material as the above-described filling metal 230. In an embodiment, the filling metal material 230a may be formed on the copper-manganese (CuMn) alloy 251a through an electroplating process. In an embodiment, the filling metal material 230a fills the trench T1, and an upper surface of the formed filling metal material 230a may be substantially flat.

Figure 11:
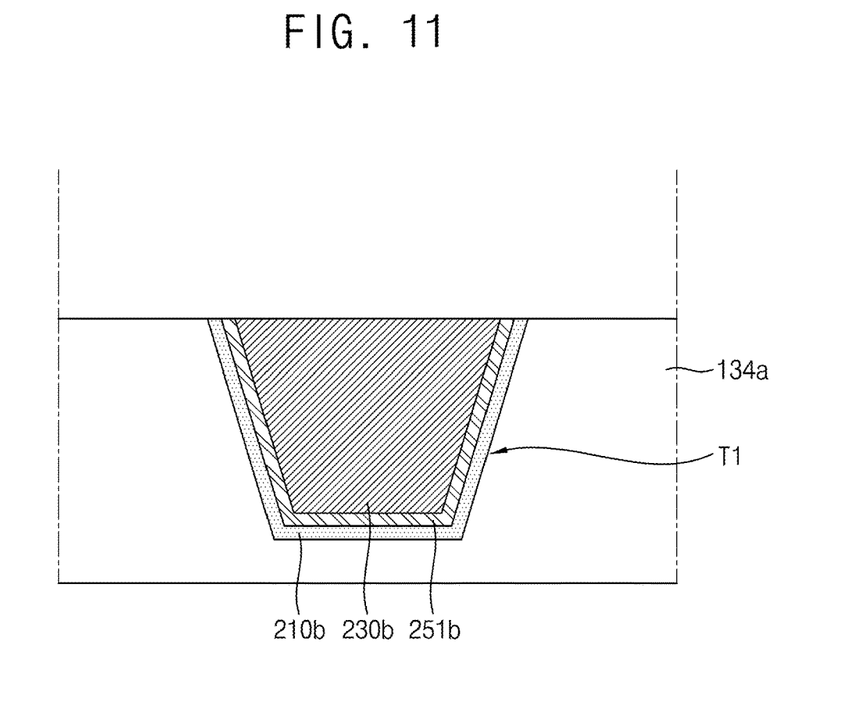

Referring to FIG. 11, portions of the formed barrier metal material 210a, the copper-manganese (CuMn) alloy 251a, and the formed filling metal material 230a disposed in a region higher than an uppermost surface of the first sub-insulating film 134a may be removed. For example, portions of the barrier metal material 210a, the copper-manganese (CuMn) alloy 251a, and the formed filling metal material 230a disposed outside the trench T1, and a portion of the filling metal material 230a disposed at a level equal to or higher than a predetermined level may be removed.

In an embodiment, portions of the barrier metal material 210a, the copper-manganese (CuMn) alloy 251a, and the formed filling metal material 230a may be removed through a chemical mechanical polishing (CMP) process. As a result, an upper surface of the first sub-insulating film 134a may be exposed in a region outside the trench T1. In addition, the partially-removed barrier metal material 210b, the partially-removed copper-manganese (CuMn) alloy 251b, and the partially-removed filling metal material 230b may be disposed in the trench T1 of the first sub-insulating film 134a. The partially-removed barrier metal material 210b constitutes the barrier metal 210, and the partially-removed filling metal material 230b may constitute the filling metal 230. The upper surface of the first sub-insulating film 134a may secure a predetermined flatness in a region outside the trench T1, together with an upper surface of the filling metal 230.

Figure 12:
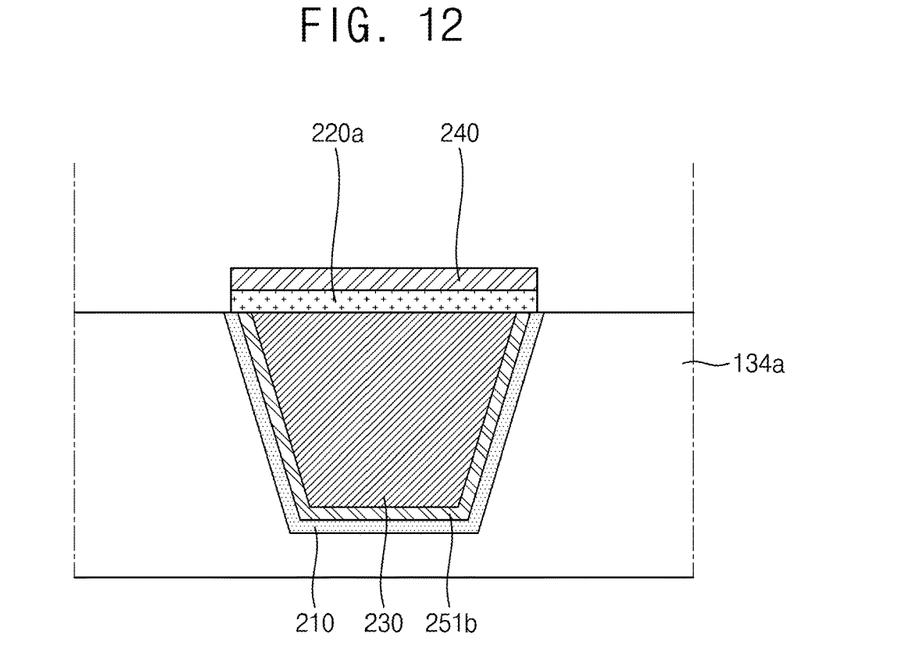

Referring to FIG. 12, a cover metal material 220a may be formed on the filling metal 230, and the capping metal 240 may be formed on an upper surface of the cover metal material 220a.

In an embodiment, the cover metal material 220a may include the same material as the above-described cover metal 220. An edge of the cover metal material 220a may extend to overlap with an upper surface of the barrier metal 210. That is, the cover metal material 220a may be formed to cover the entirety of the upper surface of the filling metal 230, the entirety of an upper surface of the copper-manganese (CuMn) alloy 251b, and at least a portion of the upper surface of the barrier metal 210. In an embodiment, the cover metal material 220a may be formed to cover the entirety of the upper surface of the filling metal 230, the entirety of an upper surface of the copper-manganese (CuMn) alloy 251b, and at least a portion of the upper surface of the barrier metal 210, through selective deposition. In some embodiments, the cover metal material 220a may not be directly disposed on the upper surface of the first sub-insulating film 134a.

In an embodiment, the capping metal 240 may be formed on the cover metal material 220a through selective deposition. The cover metal material 220a and the capping metal 240 may be sequentially formed through successive deposition.

Figure 13:
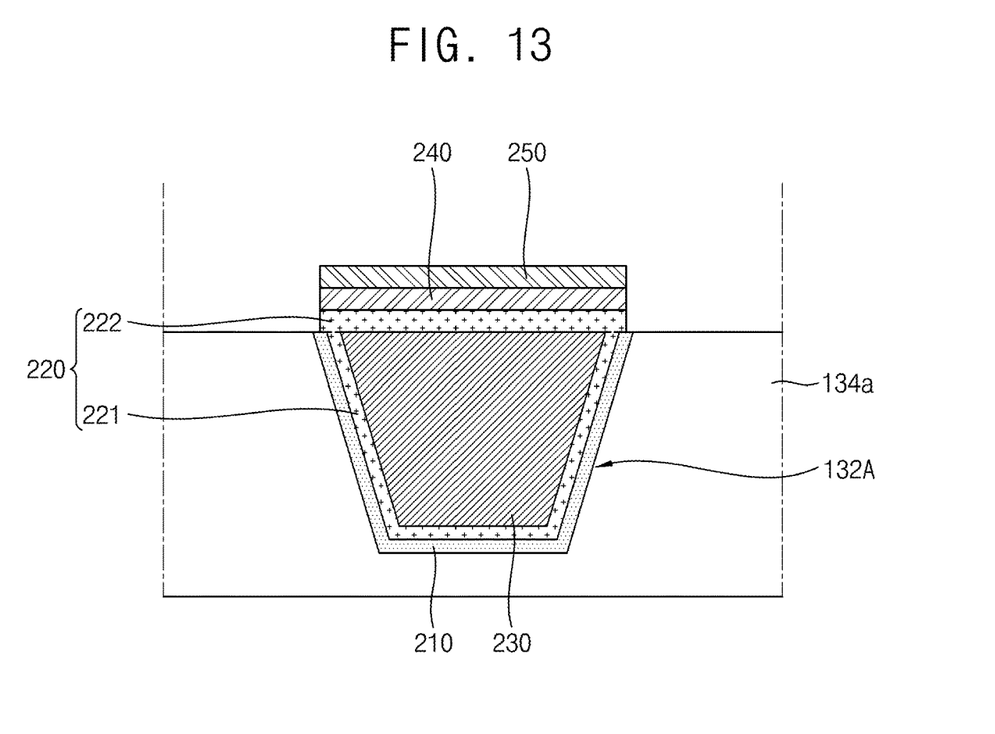

Referring to FIGS. 12 and 13, an annealing process may be subsequently performed. When the annealing process reaches a predetermined temperature, a manganese (Mn) component in the copper-manganese (CuMn) alloy 251b may migrate upwards through the capping metal 240 after passing through gaps among grains of the cover metal material 220a and the capping metal 240. For example, the annealing may be performed at a temperature of about 300° C. to 600° C. A copper (Cu) component in the copper-manganese (CuMn) alloy 251b may be coupled to the filling metal 230 having the same material as the copper (Cu) component. As the manganese (Mn) component migrates upwards through the capping metal 240, the manganese (Mn) component may constitute the top metal 250.

As the manganese (Mn) component disposed in the copper-manganese (CuMn) alloy 251b migrates upward through the capping metal 240, a space is formed between the filling metal 230 and the barrier metal 210. In this case, a portion of the cover metal material 220a disposed on the filling metal 230 fills the space between the filling metal 230 and the barrier metal 210. As a result, the filling metal 230 is surrounded by the cover metal material 220a and, as such, the cover metal material 220a may constitute a cover metal 220 divided into the above-described first portion 221 and the above-described second portion 222.

Next, a wiring structure according to another exemplary embodiment of the disclosure will be described. In the following description, no description will be given of the same constituent elements as those of FIGS. 1 to 13, and identical or similar reference numerals will be used for the constituent elements.

Figure 14:
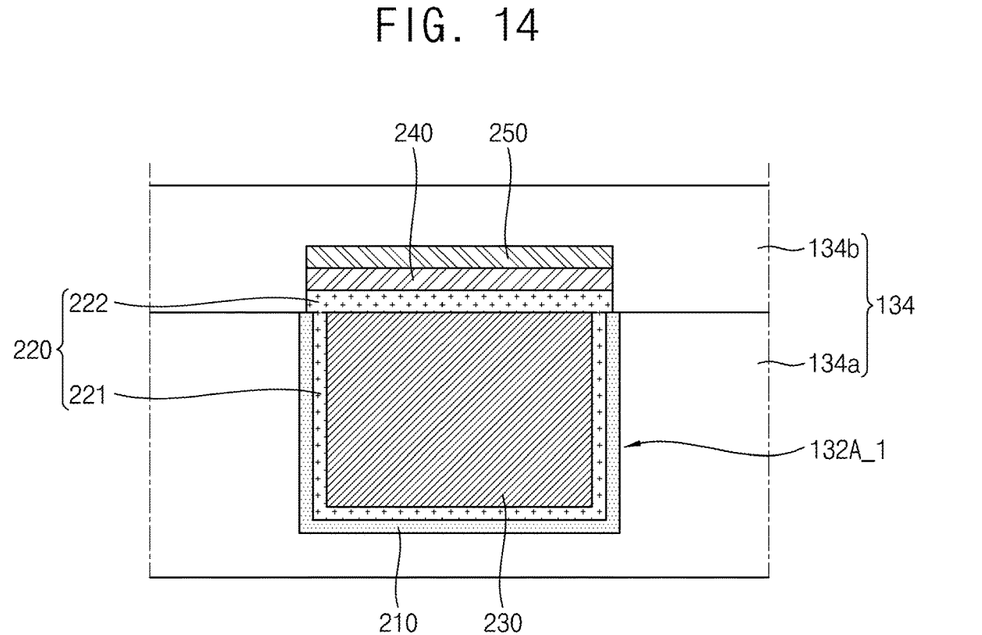
FIGS. 14 to 16 are sectional views of wiring structures according to exemplary embodiments of the disclosure, respectively.
Figure 15:
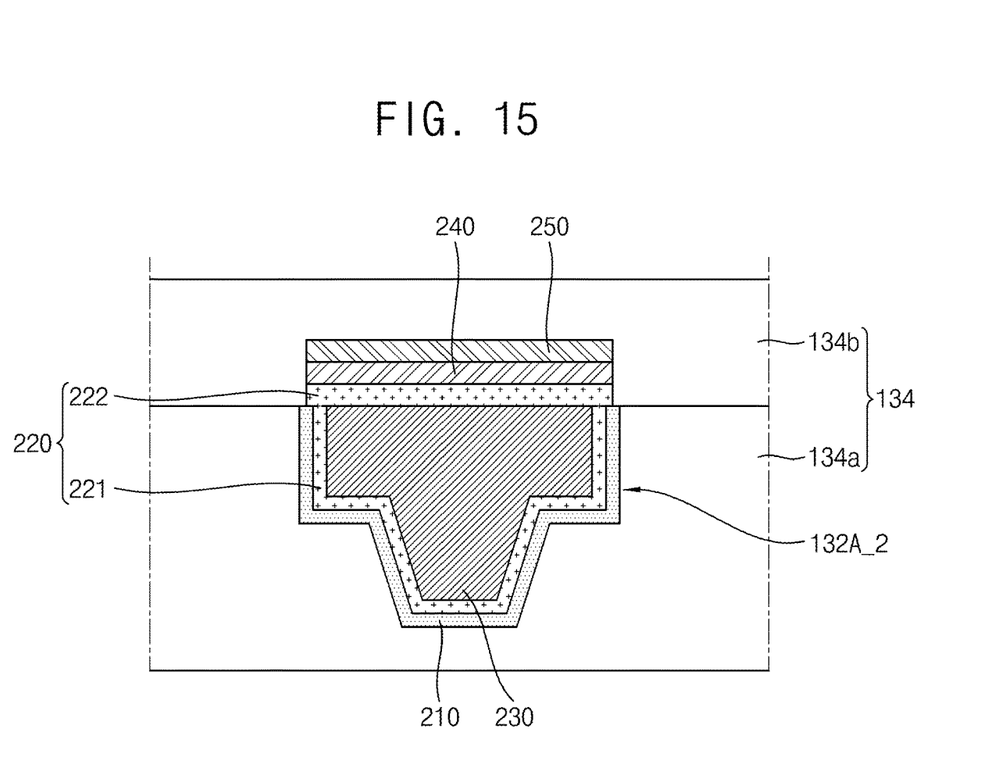
Figure 16:
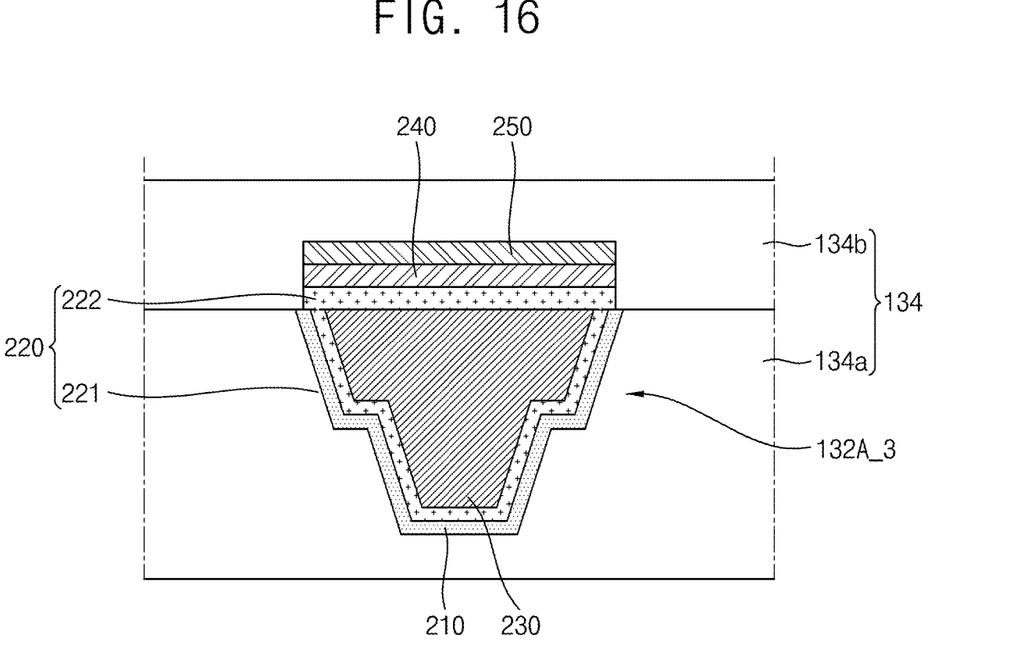

FIGS. 14 to 16 are sectional views showing wiring structures according to exemplary embodiments of the disclosure, respectively.

Referring to FIG. 14, in an embodiment, the filling metal 230 of a wiring structure 132A_1 may have a rectangular shape. The filling metal 230 may include upper and lower surfaces having the same width, and opposite side surfaces extending vertically.

Referring to FIG. 15, in an embodiment, a filling metal 230 of a wiring structure 132A_2 may include a stepped side surface. In an embodiment, the side surface may include a vertical surface at one portion thereof, and an inclined surface at another portion thereof. For example, the portion of the filling metal 230, which is a vertical surface, may be disposed adjacent to an upper surface of the filling metal 230, and the portion of the filling metal 230, which is an inclined surface, may be disposed adjacent to a lower surface of the filling metal 230. In accordance with embodiments, the side surface may further include a horizontal surface between the portion, which is a vertical surface, and the portion, which is an inclined surface.

Referring to FIG. 16, in an embodiment, the filling metal 230 of a wiring structure 132A_3 may include a stepped side surface. In an embodiment, the side surface may include a plurality of inclined surfaces. The side surface may further include a horizontal surface between the plurality of inclined surfaces.

Figure 17:
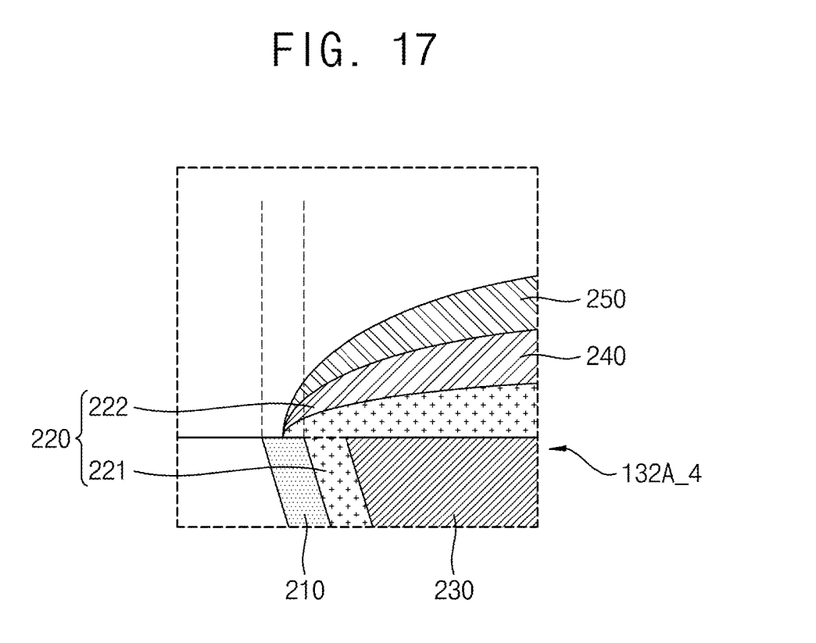
FIGS. 17 to 19 are sectional views of portions of wiring structures according to exemplary embodiments of the disclosure, respectively.
Figure 18:
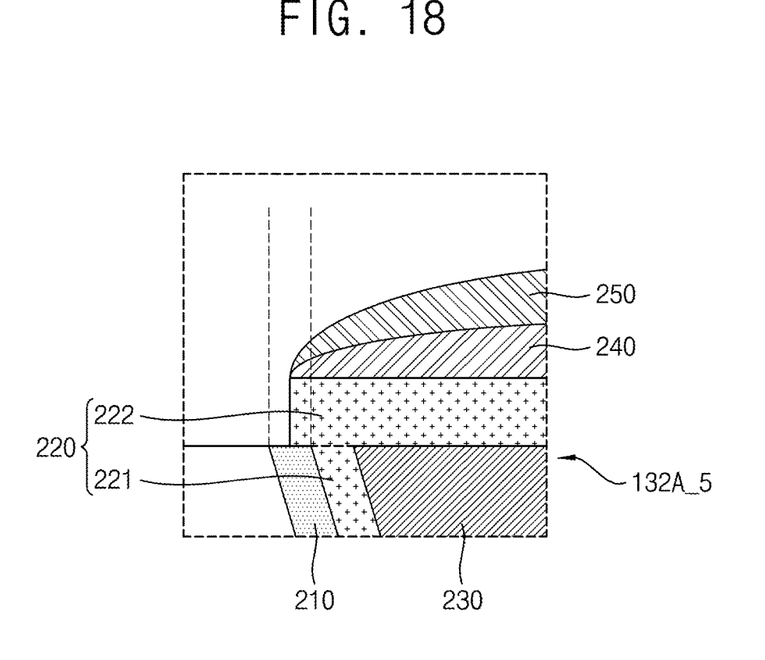
Figure 19:
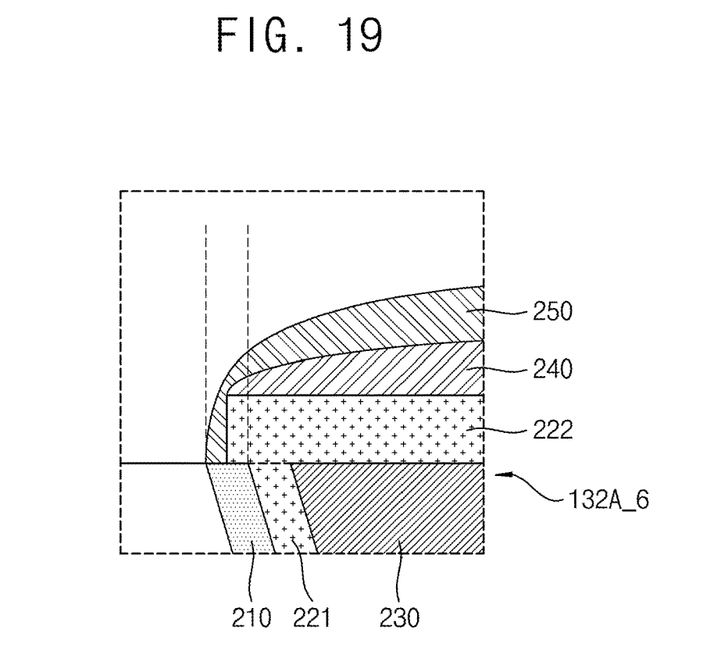

FIGS. 17 to 19 are sectional views showing portions of wiring structures according to exemplary embodiments of the disclosure, respectively.

Referring to FIG. 17, the cover metal 220 of a wiring structure 132A_4 may have a curved surface at an upper surface of the second portion 222 thereof. For example, the upper surface of the second portion 222 of the cover metal 220 may be a convex surface. Correspondingly, each upper surface of the capping metal 240 and the top metal 250 may be a curved surface.

Referring to FIG. 18, the cover metal 220 of a wiring structure 132A_5 may have a flat surface at an upper surface of the second portion 222 thereof, and the upper surface of the second portion 222 of the cover metal 220 may be a curved surface (e.g., a convex surface).

Referring to FIG. 19, in a wiring structure 132A_6, the top metal 250 thereof may extend to be directly disposed on the barrier metal 210, differently from the wiring structure 132A_5 of FIG. 18, and may have a flat surface at an upper surface of the second portion 222 thereof. The upper surface of the second portion 222 of the cover metal 220 may be a curved surface (e.g., a convex surface).

By way of summation and review, since down-scaling of wiring structures in semiconductor chips is increasing, the resultant wiring structures may exhibit degraded reliability characteristics (e.g., decreased EM life). Therefore, technology capable of increasing EM life of the wiring structure is required.

Exemplary embodiments provide a wiring structure having an improved EM, a manufacturing method thereof, and an integrated circuit chip having the same. That is, in accordance with exemplary embodiments of the disclosure, it is possible to improve EM life of a wiring structure through capping of an upper surface, a lower surface, and side walls of the wiring structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wiring structure, comprising:
a filling metal;
a cover metal including cobalt (Co) on the filling metal, the cover metal having:
a first portion along a side surface and along a lower surface of the filling metal, and
a second portion along an upper surface of the filling metal;
a barrier metal on an outer surface of the first portion of the cover metal; and
a capping metal on an outer surface of the second portion of the cover metal, the capping metal including a cobalt (Co) alloy,
wherein the filling metal has higher conductivity than the cover metal and the barrier metal,
wherein the second portion of the cover metal completely covers the upper surface of the filling metal, the first and second portions of the cover metal contacting each other to completely surround all outer surfaces of the filling metal, and
wherein an edge of the second portion of the cover metal extends beyond the first portion of the cover metal to directly contact an upper surface of the barrier metal.

2. The wiring structure as claimed in claim 1, wherein the filling metal includes copper (Cu).

3. The wiring structure as claimed in claim 2, wherein the cover metal consists of cobalt (Co).

4. The wiring structure as claimed in claim 1, wherein the cobalt (Co) alloy includes cobalt (Co) and at least one of gold (Au), silver (Ag), tungsten (W), lead (Pb), and phosphorous (P).

5. The wiring structure as claimed in claim 1, further comprising a top metal on an outer surface of the capping metal, the top metal including manganese (Mn).

6. The wiring structure as claimed in claim 1, wherein:
the cover metal is directly on the filling metal; and
the barrier metal is directly on the first portion of the cover metal.

7. The wiring structure as claimed in claim 6, wherein each of the cover metal and the barrier metal does not include manganese (Mn).

8. The wiring structure as claimed in claim 1, wherein the first portion of the cover metal has a thickness of about 5 nm.

9. The wiring structure as claimed in claim 8, wherein the second portion of the cover metal is thicker than the first portion of the cover metal.

10. The wiring structure as claimed in claim 1, wherein oxygen contents (%) of the first and second portions of the cover metal are equal to each other.

11. The wiring structure as claimed in claim 1, wherein an upper surface of the first portion of the cover metal is flat.

12. An integrated circuit chip, comprising:
a substrate;
a front-end-of-line (FEOL) structure on a first surface of the substrate, the FEOL structure including transistors; and
a back-end-of-line (BEOL) structure on the FEOL structure, the BEOL structure including a multilayer wiring structure and an interlayer insulating film insulating a part of the multilayer wiring structure, and the interlayer insulating film including sub-insulating films, wherein at least one wiring of the multilayer wiring structure is in a trench, the trench being in one of the sub-insulating films of the interlayer insulating film, and the wiring including:

a filling metal in the trench, the filling metal including copper (Cu), a cover metal including cobalt (Co) on the filling metal, the cover metal having a first portion along a side surface and along a lower surface of the filling metal, and a second portion along an upper surface of the filling metal, a barrier metal on an outer surface of the first portion of the cover metal, while being directly on the trench, a capping metal on an outer surface of the second portion of the cover metal, the capping metal including a cobalt (Co) alloy, and a top metal on the capping metal, the top metal including manganese (Mn), wherein the second portion of the cover metal completely covers the upper surface of the filling metal, the first and second portions of the cover metal contacting each other to completely surround all outer surfaces of the filling metal, and wherein an edge of the second portion of the cover metal extends beyond the first portion of the cover metal to directly contact an upper surface of the barrier metal.

13. The integrated circuit chip as claimed in claim 12, wherein the cobalt (Co) alloy is a cobalt-tungsten-phosphorous (CoWP) alloy.

14. The integrated circuit chip as claimed in claim 12, wherein a level of an upper surface of the second portion is higher than a level of an upper surface of the one sub-insulating film.

* * * * *